United States Patent [19]

Schreck et al.

[11] Patent Number: 4,802,121

[45] Date of Patent: Jan. 31, 1989

[54] MEMORY ARRAY WITH PARTITIONED BIT LINES

[75] Inventors: John F. Schreck; Jeffrey K. Kaszubinski, both of Houston, Tex.

[73] Assignee: Texas Instruments Incorporated, Dallas, Tex.

[21] Appl. No.: 869,471

[22] Filed: Jun. 2, 1986

[51] Int. Cl.$^4$ ............................................. G11C 17/00
[52] U.S. Cl. ................................................... 365/104
[58] Field of Search ............... 365/103, 104, 189, 190, 365/185

[56] References Cited

U.S. PATENT DOCUMENTS 4,342,099 7/1982 Kuo .................................. 365/104
4,460,981 7/1984 Van Buskirk et al. ............ 365/189

Primary Examiner—Joseph A. Popek
Attorney, Agent, or Firm—John G. Graham; Theodore D. Lindgren

[57] ABSTRACT

A memory array having two separate sets of parallel bit lines, and a word line intersecting the sets of bit lines. The memory cells are floating-gate MOS transistors having gates coupled to associated ones of the word lines and source-to-drain paths connected between alternating ones of the sets of bit lines and ground lines.

12 Claims, 2 Drawing Sheets

MEMORY ARRAY WITH PARTITIONED BIT LINES

BACKGROUND OF THE INVENTION

The present invention relates to a VLSI memory array with a layout that minimizes bit line loading so as to improve speed.

In memory arrays there is a delay in charging up the word lines being selected due to the conductor resistance, in the capacitance represented by the devices attached to the word line and in parasitic capacitance between the word lines and bit lines. Since the bit lines are normally metal the resistance of the bit lines is small and the capacitance represented by the attached devices is the main contributor to the bit line load. For the word lines the parasitic capacitance to each crossing bit line is relatively small so that the main load contributor is the conductor resistance and the capacitance of each device attached to the word line.

Accordingly, it is a principal object of the present invention to provide a memory array layout which considerably increases the speed of the array.

SUMMARY OF THE INVENTION

According to the invention there is provided a memory array having a plurality of YA and YB bit lines, a plurality of word lines intersecting said YA and YB bit lines, and a plurality of memory cells coupled to associated ones of said word lines and said YA and YB bit lines. Half of the memory cells in each column are connected to a corresponding one of the YA bit lines and the other half to a corresponding one of the YB bit lines.

By partitioning the bit lines among the cells in each column it is possible to reduce the total bit line capacitance and to incur only a modest increase in the delay time for each word line.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION WITH REFERENCE TO THE DRAWINGS

Figure 1:
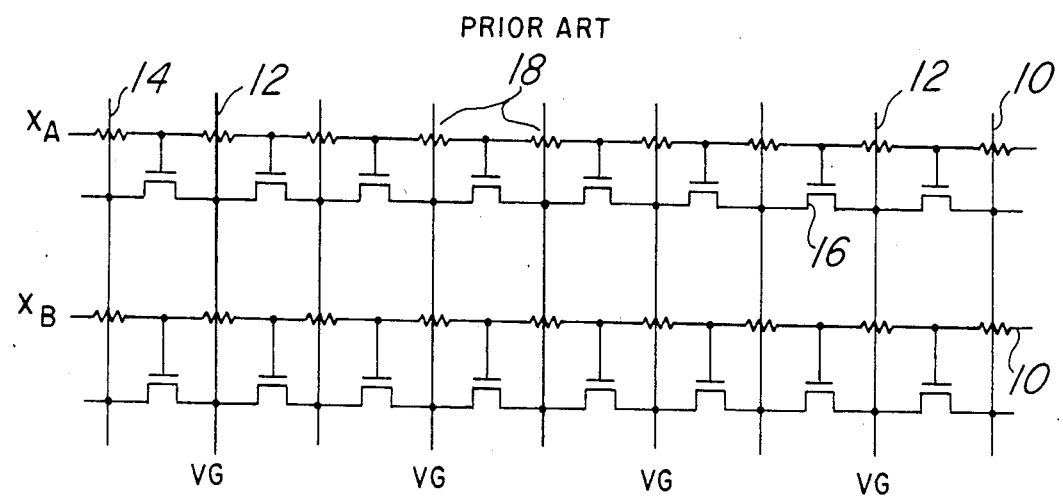
FIG. 1 is a circuit diagram of a portion of a conventional array of memory cells in a layout utilizing virtual grounds.

Referring to FIG. 1, there is shown a portion of a conventional array of memory cells 16 such as electronically programmable read only memory cells the control gates of which are coupled to one of two word lines 10 or 18 and whose source is connected to a corresponding one of virtual ground lines 12. The drain of each cell 16 in a given column is coupled to an associated bit or column line 14. Since either the bit lines 14 or the word lines 10 and 18 are metal it will be assumed that it is the bit lines which are metal and have a corresponding low resistance. The word lines which would typically be doped polysilicon are represented as having a resistance which depends on the number of column lines crossed. The latter relationship exists because of the regular spacing of column lines so as to achieve a maximum density of devices.

In accessing a particular cell if it is assumed that $N_x$ is the number of bits in the X-direction and $N_y$ is the number of bits in the Y-direction. If $R_x$ is the unit resistivity of the word line, $C_x$ is the capacitance of the cells 16 in the X-direction attached to the word line 10, and $C_{px}$ is the capacitance associated with the interconnects and the word line 10 then the loading associated with the word line 10 consists of a distributed resistance 18 equal to $XR_x$ and a capacitance equal to $N_x(C_x+C_{px})$. Since normally $C_{px}$ is small compared with $C_x$ the former can be neglected in comparison with the latter. The loading associated with the column line or bit line 12 is $N_yC_y$. By rearranging the organization of an array so that there are twice as many bits in the Y-direction as in the X-direction the loading in the X-direction is $\frac{1}{2} \times R_x$ (resistive) and $\frac{1}{2} C_xN_x$ (capacitive) while the loading in the Y direction is $2N_yC_y$ (capacitive). Clearly, other results are obtainable by simply arranging the organization of the array to achieve the desired result. The change in array structure obviously determines the loading and depending upon the values of $R_x$, $C_x$, and $C_y$ one type of arrangement may be preferable to another.

Figure 2:
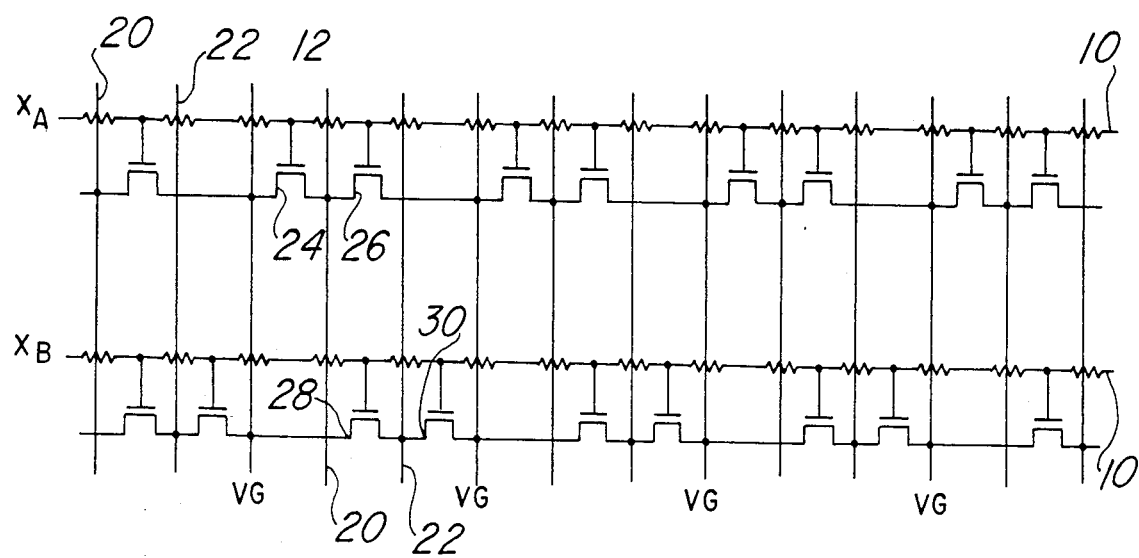
FIG. 2 is a circuit diagram of a portion of an array employing a virtual ground in accordance with a preferred embodiment of the invention.

FIG. 2 shows a partitioning of the bit lines such that each bit line 14 shown in FIG. 1 is replaced by two bit lines 20 and 22 as seen in FIG. 2. The cells in a column of the array of FIG. 1 are divided into two with half connected between one of bit lines 20 and 22 and virtual ground line 12 and the other half connected between the other of bit lines 20 and 22 and the same virtual ground line 12. The different cell connections are shown by representative cells 24, 26, 28, and 30. In this case the total number of column lines crossed as shown in FIG. 2 is 14 while for an unpartitioned array the equivalent number of bits would have only 9 column lines, namely 4 virtual ground lines and 5 bit lines. Thus, the ratio of total distributed resistance for the array of FIG. 1 to that of an equivalent number of bits for the circuit of FIG. 2 of the array is 14/9 or 1.56. For a very large array this ratio approaches 1.5. Moreover, the bit line capacitance of any bit line 20 or 22 will be half that of the circuit of FIG. 1. The word line capacitance would stay about the same. The net effect is that partitioning of the bit lines results in an overall increase in speed of the array. This speed increase comes at the expense of increased array area which makes it suitable for devices having a lower density than that of the circuit of FIG. 1.

Figure 3:
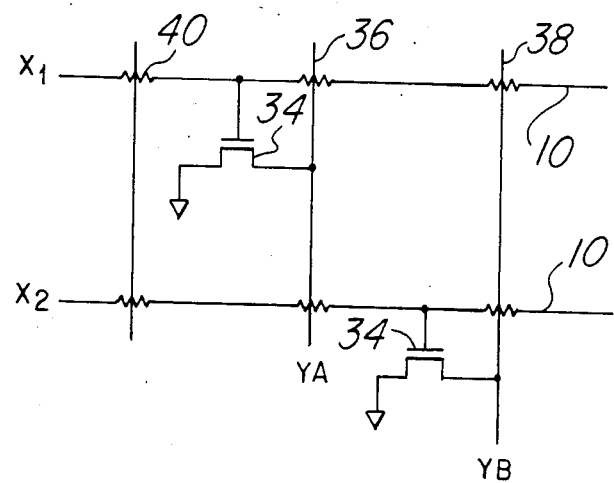
FIG. 3 is a circuit diagram of a small portion of an array which does not include a virtual ground.

In a regular array as shown in FIG. 3, doubling of the number of bit lines to form a first set YA and a second set YB of bit lines requires twice as many bit lines as a regular array and hence twice the resistance in accessing a given cell. However, the capacitance on both the word line and each bit line is halved leading to the same delay in the word line but a reduced loading on the bit line.

It is obviously possible to rearrange the organization of an array while at the same time implementing the above described changes to make the bit line delay equal approximately to the word line delay. This would require in a conventional array with approximately equal bit line and word line delays making the number of word lines $\frac{1}{2}$ of the conventional array before doubling them according to the present invention and doubling the number of bit lines from the number in a conventional array.

While this invention has been described with reference to an illustrative embodiment, this description is not intended to be construed in a limiting sense. Various modifications of the illustrative embodiments, as well as other embodiments of the invention, will be apparent to persons skilled in the art upon reference to this description. It is, therefore, contemplated that the appended claims will cover any such modifications or embodiments as fall within the true scope of the invention.

What is claimed is:

1. An array of memory cells, comprising:
   first and second sets further comprised of alternating parallel bit lines;
   a set of virtual ground lines, each of which is parallel to and alternating with pairs of said bit lines of said first and second sets;
   a plurality of word lines intersecting said parallel bit lines and virtual ground lines;
   a plurality of said memory cells arrayed in rows and columns, each of said memory cells coupled to one of said word lines, to one of said parallel virtual ground lines, and to one of said parallel bit lines;
   wherein each of said memory cells in alternating rows is connected to a bit line of said first set of alternating parallel bit lines and each of said memory cells in the other alternating rows is connected to a bit line of said second set of said parallel bit lines.

2. An array according to claim 1, wherein said memory cells are electrically programmable read only memory cells.

3. An array according to claim 1, wherein said bit lines are metal.

4. An array according to claim 1, wherein said word lines are polycrystalline silicon.

5. An array of memory cells, comprising:
   a plurality of virtual ground lines;
   a plurality of parallel bit lines alternating to comprise a first set and a second set of bit lines;
   a plurality of word lines intersecting said parallel bit lines and said virtual ground lines; and
   a plurality of said memory cells arrayed in rows and columns and coupled to associated ones of said word lines, to associated ones of said virtual ground lines, and to associated ones of said parallel bit lines;
   wherein alternating memory cells in each of said columns are connected to one of said first set of bit lines and the other alternating memory cells in each of said columns are connected to one of said second set of bit lines.

6. An array according to claim 5, wherein said memory cells are electrically programmable read only memory cells.

7. An array according to claim 5, wherein said bit lines are metal.

8. An array according to claim 5, wherein said word lines are polycrystalline silicon.

9. A method of partitioning bit lines and word lines in an array of memory cells, comprising:
   forming a first and a second bit line for each column of memory cells in said array; and
   connecting alternate memory cells in each column to said first bit line and connecting other alternate memory cells in each column to said second bit line.

10. A method according to claim 9 wherein said memory cells are floating-gate MOS transistors connected between said bit lines and ground lines.

11. An array according to claim 1 wherein said memory cells are floating-gate transistors having source-to-drain paths connected between said bit lines and ground lines.

12. An array according to claim 11 wherein said word lines are connected to control gates of said transistors.

* * * * *